United States Patent
Barbier et al.

(10) Patent No.: US 11,420,464 B2
(45) Date of Patent: Aug. 23, 2022

(54) PHOTOSENSITIVE PRINTING FORM FOR A FLEXOGRAPHIC PRINTING METHOD COMPRISING VISIBLE AND NON-PRINTABLE INFORMATION, AND METHOD FOR PREPARING SUCH A PRINTING FORM

(71) Applicant: Esko-Graphics Imaging GmbH, Itzehoe (DE)

(72) Inventors: Olivier Barbier, Balan (FR); Jonathan Schmitt, Salagnon (FR)

(73) Assignee: Esko-Graphics Imaging GmbH, Itzehoe (DE)

(*) Notice: Subject to any disclaimer, the term of this patent is extended or adjusted under 35 U.S.C. 154(b) by 0 days.

(21) Appl. No.: 17/056,584

(22) PCT Filed: Aug. 30, 2019

(86) PCT No.: PCT/EP2019/073200
§ 371 (c)(1),
(2) Date: Nov. 18, 2020

(87) PCT Pub. No.: WO2020/043875
PCT Pub. Date: Mar. 5, 2020

(65) Prior Publication Data
US 2021/0206190 A1 Jul. 8, 2021

(30) Foreign Application Priority Data
Aug. 31, 2018 (FR) ...................................... 1857875

(51) Int. Cl.
*G03F 7/20* (2006.01)
*B41C 1/05* (2006.01)
(Continued)

(52) U.S. Cl.
CPC ................ *B41N 1/12* (2013.01); *B41C 1/006* (2013.01); *B41C 1/05* (2013.01); *G03F 7/202* (2013.01)

(58) Field of Classification Search
None
See application file for complete search history.

(56) References Cited

U.S. PATENT DOCUMENTS

| 4,872,407 A | 10/1989 | Banke |
| 7,126,724 B2 | 10/2006 | McCrea et al. |

(Continued)

FOREIGN PATENT DOCUMENTS

| CN | 1920663 A | 2/2007 |
| CN | 200984850 Y | 12/2007 |

(Continued)

OTHER PUBLICATIONS

International Preliminary Report on Patentability and Written Opinion for International Application No. PCT/EP2019/052536, dated Oct. 6, 2020, 10 pages.

(Continued)

*Primary Examiner* — Joshua D Zimmerman
(74) *Attorney, Agent, or Firm* — RatnerPrestia

(57) ABSTRACT

A photosensitive flexographic printing form, and process for manufacturing the same. The printing form includes a base, a first series of relief patterns having a first elevation with respect to the base in an image area of the base, and a second series of relief patterns having one or more elevations lower than the first elevation and located outside of the image area.

13 Claims, 3 Drawing Sheets

(51) Int. Cl.
B41N 1/12 (2006.01)
B41C 1/00 (2006.01)

(56) References Cited

U.S. PATENT DOCUMENTS

| | | |
|---|---|---|
| 7,810,731 B2 | 10/2010 | Johnson et al. |
| 7,908,967 B2 | 3/2011 | Kwon et al. |
| 8,468,941 B2 | 6/2013 | Hackler et al. |
| 8,757,479 B2 | 6/2014 | Clark et al. |
| 9,016,199 B2 | 4/2015 | Ramakrishnan |
| 9,375,916 B2 | 6/2016 | Thomas et al. |
| 10,919,330 B2 | 2/2021 | Wattyn |
| 2002/0120493 A1 | 8/2002 | Mormile |
| 2005/0157347 A1 | 7/2005 | Dewitte |
| 2007/0084368 A1 | 4/2007 | Vest et al. |
| 2009/0195837 A1 | 8/2009 | Dardikman et al. |
| 2010/0028815 A1 | 2/2010 | Zwadlo |
| 2010/0060909 A1 | 3/2010 | Conescu et al. |
| 2011/0189600 A1 | 8/2011 | Plumer et al. |
| 2011/0308411 A1 | 12/2011 | Thomas et al. |
| 2012/0003588 A1 | 1/2012 | Choi et al. |
| 2013/0058542 A1 | 3/2013 | Gnutzmann et al. |
| 2014/0166761 A1 | 6/2014 | Todeschini et al. |
| 2014/0326152 A1 | 11/2014 | Gartner et al. |
| 2015/0217558 A1 | 8/2015 | Bielak |
| 2018/0035614 A1 | 2/2018 | Davis et al. |
| 2018/0210345 A1 | 7/2018 | Wolterink et al. |
| 2021/0245542 A1 | 8/2021 | Kaufmann et al. |

FOREIGN PATENT DOCUMENTS

| | | |
|---|---|---|
| CN | 101283314 A | 10/2008 |
| CN | 103959435 A | 7/2014 |
| CN | 108463352 A | 8/2018 |
| DE | 102018115146 A1 | 12/2019 |
| EP | 0169294 A2 | 1/1986 |
| EP | 1531014 A2 | 5/2005 |
| EP | 1557279 A2 | 7/2005 |
| EP | 2397327 A2 | 12/2011 |
| EP | 2428360 A1 | 3/2012 |
| EP | 2722713 A2 | 4/2014 |
| FR | 3085304 A1 | 3/2020 |
| JP | 2000181051 A * | 6/2000 |
| JP | 2000181051 A | 6/2000 |
| JP | 2002223095 A | 8/2002 |
| JP | 2006048053 A | 2/2006 |
| WO | 2010014156 A1 | 2/2010 |
| WO | 2017072588 A2 | 5/2017 |
| WO | 2019110809 A1 | 6/2019 |
| WO | 2019192764 A1 | 10/2019 |

OTHER PUBLICATIONS

International Search Report and Written Opinion for International Application No. PCT/EP2019/052536, dated Jun. 18, 2019, 12 pages.
International Search Report and Written Opinion for International Application No. PCT/EP2019/073200, dated Nov. 15, 2019, 9 pages.
International Application No. PCT/EP2019/073200, dated Aug. 30, 2019, 27 pages.
U.S. Appl. No. 62/839,171, filed Apr. 28, 2018, 32 pages.
Entire patent prosecution history of U.S. Appl. No. 17/045,253, filed Oct. 8, 2020, entitled, "Method for Persistent Marking of Flexo Plates With Workflow Information and Plates Marked Therewith.".
Entire patent prosecution history of U.S. Appl. No. 16/433,873, filed Jun. 8, 2019, entitled, "System and Process for Persistent Marking of Flexo Plates and Plates Marked Therewith.".
Entire patent prosecution history of U.S. Appl. No. 16/559,702, filed Sep. 4, 2019, entitled, "System and Process for Persistent Marking of Flexo Plates and Plates Marked Therewith.".
International Search Report and Written Opinion for international Application No. PCT/EP2020/078112, dated Jan. 29, 2021, 18 pages.
Non Final Office Action for U.S. Appl. No. 16/433,873, dated Jun. 9, 2021, 28 pages.
International Search Report and Written Opinion for International Application No. PCT/EP/2019/076922, dated Jan. 7, 2020, 15 pages.
Non Final Office Action for U.S. Appl. No. 17/045,253, dated Mar. 21, 2022, 21 pages.
Chinese Office Action for Chinese Application No. 201980038697. 2, dated Mar. 14, 2022 with translation, 15 pages.
Guo, W. et al., "Image Relief Algorithm and Its Application in Security Printing," Feb. 5, 2011, vol. 3(1), 5 pages, China Printing and Packaging Study (abstract only).
Xu, S., "A Few Questions about Flexographic Printing Technology," 2 pages, Feb. 10, 1996, China Packaging Industry.
International Preliminary Report on Patentability and Written Opinion for International Application No. PCT/EP2020/078112, dated Apr. 12, 2022, 12 pages.
European Communication pursuant to Article 94(3) for European Application No. 19 780 253.1, dated Apr. 28, 2022, 6 pages.

* cited by examiner

PHOTOSENSITIVE PRINTING FORM FOR A FLEXOGRAPHIC PRINTING METHOD COMPRISING VISIBLE AND NON-PRINTABLE INFORMATION, AND METHOD FOR PREPARING SUCH A PRINTING FORM

CROSS-REFERENCE TO RELATED APPLICATIONS

This patent application is a U.S. National Phase Patent Application of PCT Application No. PCT/EP2019/073200, filed 30 Aug. 2019, which claims priority to French Patent Application No. 1857875, filed 31 Aug. 2018, each of which is incorporated by reference herein in its entirety.

FIELD OF THE INVENTION

The present invention relates to the preparation of printing forms. It more particularly pertains to preparing a photosensitive printing form for a flexographic printing method, the printing form comprising visible and non-printable information.

TECHNICAL BACKGROUND OF THE INVENTION

In the field of printing, the tasks of creation, composition, printing graphical or textual content to be reproduced on a printing medium are designated by the expression "design and printing process".

This process mainly comprises three steps of layout, prepress and printing. Layout aims to prepare the textual or graphical content to be reproduced on the printing medium; prepress aims, using the documents resulting from the layout step, to produce the printing forms. The printing step uses the printing forms to reproduce the textual and/or graphical content on the printing medium.

Prepress is a key element of the design and printing process. It particularly comprises a control step for the content to be reproduced. This content is generally provided as a computer file. During the control step, it is checked, using a graphics editor on a computer workstation, if the content is indeed compatible with the remainder of the workflow, i.e. if it can cause irregularities or non-compliance with printing. It can be a matter, for example, of checking that the text is indeed within a sufficient size to allow the printing thereof and the reading thereof on the final medium.

Prepress also comprises an imposition step. This step, which can be carried out using the same graphics editor and on the same computer workstation as the control step, particularly aims to group together on a same medium, in amalgam, various content such as to be able to manufacture a plurality of printing forms, in a single step, and best utilize the capacity of the equipment for making these printing forms while limiting the use of consumables.

Prepress also comprises, on a computer workstation, a rasterization step which aims to provide, by separation and screening of the files representing the content to be printed, primary computer files in a format that can be understood by the equipment for manufacturing the printing forms, such as inscription lasers or cutting tables for example. For color printing, generally a plurality of primary files corresponding to the content to be printed for each of the primary colors or for direct shades is generated. The images contained in these files are formed from dots placed in halftone or of full tone. Depending on the nature of the medium, this step defines the features and the distribution of the halftone dots, and particularly the screen ruling (the number of screen lines to the inch, each line being made up of halftone dots), the shape of each dot and the orientation angle of the screens. This step can also comprise the adjustment of some of these features to take into account the constraints of manufacturing the printing forms. When several printing forms are made from a same medium, inserted into the computer file intended to be sent to the production equipment is information allowing the cutting of the individual printing forms after they have been made collectively on the single medium. When this cutting is carried out on an automatic cutting table, this information provides the coordinates for the cutting to be carried out on the medium in a format that can be understood by the machine. When cutting is manual, for example using a guillotine, the cutting information can correspond to relief patterns produced on the medium, such as squares delimiting the size of the individual printing forms.

When printing is implemented using a flexographic method, the printing form then takes the form of a block or a sleeve. The block or the sleeve has relief patterns, representing for example the halftone dots or full tones, arranged at the surface according to the graphical and/or textual content to be reproduced. These relief patterns are intended to receive the printing ink for the purpose of reproducing the graphical and/or textual content on the printing medium. The blocks are generally manufactured using inscription lasers and cutting tables mentioned above, and are mounted on image carriers such as to be able to functionally fit in the printing machine. Alternatively, the printing form can be manufactured directly as a sleeve. In any case, this manufacture is carried out using a photosensitive material, for example by means of etching and exposure steps. In the remainder of this description, "photosensitive printing form" will refer to any printing form that can be used in a flexographic printing method.

It is frequent to provide, after the manufacture thereof, a step of marking a photosensitive printing form for the identification thereof. This marking must not result in forming a relief which could be inked and mark the printing medium. In a known manner, the blocks or sleeves are therefore marked with an identifier, inscribed by means of a marker or a felt pen on the back thereof or etched on the front face using a $CO_2$ laser or by any other mechanical or chemical means of etching. This manual or additional step is not integrated into the workflow of the design and printing process, which is a disadvantage in terms of traceability and quality. It requires the use of additional tools or equipment, which is not industrially advantageous. For example, the felt pen manual marking of a block after the manufacture thereof can be incorrect and deteriorate over time.

Therefore, the aim of the invention is to at least partially solve this problem. Generally, the invention aims to integrate, upstream of a workflow of the design and printing process, information, for example for identifying a photosensitive printing form or for dimensioning such a form. This information is incorporated in the computer file resulting from the rasterization step and is integrated in the photosensitive printing form during the manufacture thereof, without affecting the reproduction of the content on the printing medium.

BRIEF DESCRIPTION OF THE INVENTION

To achieve this aim, the subject matter of the invention proposes a photosensitive printing form for a flexographic printing method, the printing form comprising:

a base;

a first series of relief patterns placed on an image area of the base, the patterns of the first series having a first elevation with respect to the base;

a second series of relief patterns, placed outside the image area of the base, the patterns of the second series of patterns having a second elevation with respect to the base, the second elevation being lower than the first elevation.

According to other advantageous and nonlimiting features of the invention, taken individually or in any technically achievable combination:

the second series of relief patterns is arranged on the base such as to form identification information for the block;

the second series of relief patterns is arranged on the base such as to form cutting reference points.

According to another aspect, the subject matter of the invention proposes a method of manufacturing a photosensitive printing form for a flexographic printing method, the manufacturing method comprising the following steps:

preparing a rasterized file from at least one file of graphical and/or textual content to be reproduced;

processing, using the rasterized file, a flexographic plate in order to form a first series of relief patterns which are borne by a base in an image area of the block, the first series of relief patterns representing the graphical and/ or textual content to be reproduced and having a first elevation (e1) with respect to the base.

According to the invention, the preparation of the rasterized file also comprises the definition of a second series of patterns, which is placed outside the image area, the features of the patterns being such that after the processing of the flexographic plate, the latter has a second series of relief patterns, the patterns of the second series of patterns having an elevation with respect to the base, which is lower than the first elevation.

Advantageously, the processing of the flexographic plate comprises the laser engraving thereof, the exposure thereof and the development thereof.

BRIEF DESCRIPTION OF THE DRAWINGS

Other features and advantages of the invention will emerge from the following detailed description of the invention with reference to the appended figures wherein.

DETAILED DESCRIPTION OF AN EMBODIMENT OF THE INVENTION

Figure 1:
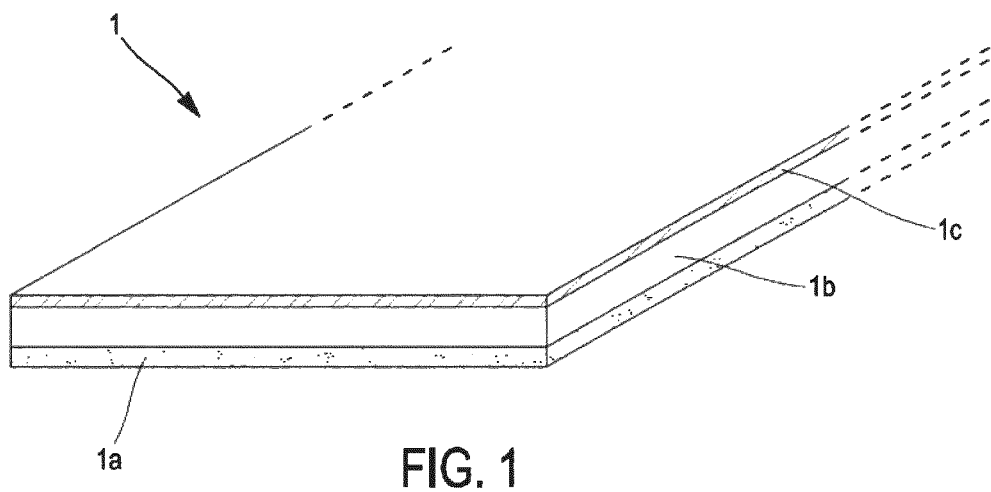
FIG. 1 represents a flexographic plate.
Figure 2:
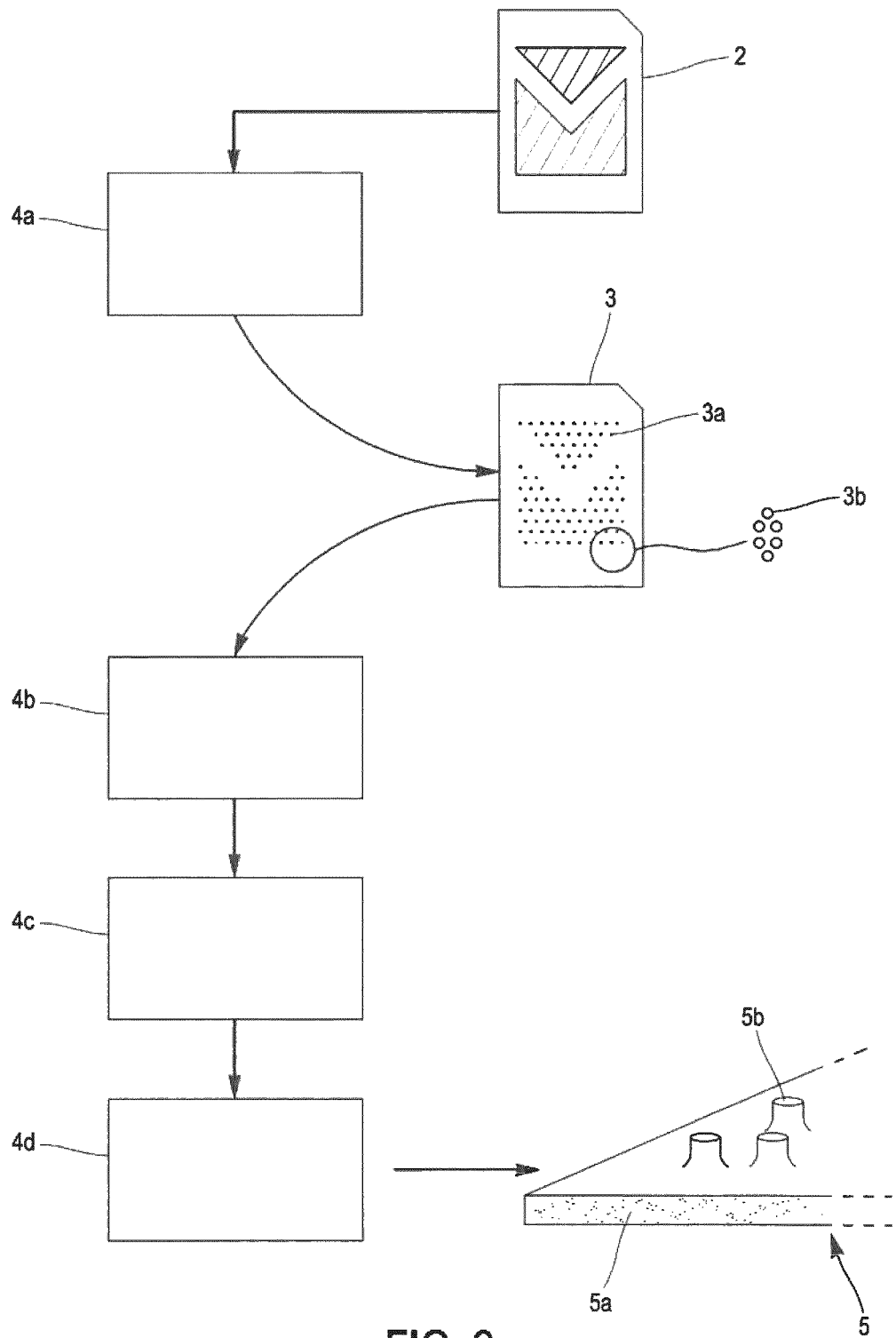
FIG. 2 represents a method of manufacturing a flexographic block according to the prior art.

Referring to FIGS. 1 and 2, the main steps for manufacturing a flexographic block are firstly recalled. Such a block results from the processing of a flexographic plate 1, typically made up of a photosensitive polymer layer 1b. This layer can be placed on a UV-transmitting medium 1a, generally made of polyester. The photosensitive polymer layer is covered with a black layer 1c, typically carbon black combined with a binder to promote the adhesion thereof to the underlying polymer layer 1b. The plate can comprise layers or features other than those described, such as for example additional layers making it possible to promote the production of a block having relief patterns, the upper surface of which is remarkably planar.

The flexographic plate 1 can be large and can be, for example, in the shape of a rectangle, the width and/or the length of which can be several meters. However, the invention is in no way limited to the use of plates having such a shape or such dimensions.

Content to be printed is provided as a computer file 2, for example in PDF format. It is processed during the prepress workflow, as has been described in the introduction of this application. Thus, a rasterized file 3 which can be understood by the equipment for manufacturing the block is prepared during a rasterization step 4a. As has already been mentioned in the introduction of this application, a rasterized file can incorporate the definition of several blocks.

The rasterized file 3 represents the content to be printed as a so-called "1-bit" image. The 1-bit image is made up of a plurality of patterns 3a, typically halftone dots or full tones, each pattern 3a itself being defined by a plurality of 1-bit pixels 3b, as is made clear in the insert of FIG. 2. These 1-bit pixels 3b of the image make up the rasterized file 3 which is transmitted to the production chain in order to form a block which will make it possible to reproduce the content of the original file 2 on the printing medium. This rasterized file 3 can comprise other information, such as cutting information which can be understood by the cutting automatic equipment.

More specifically, during an engraving step 4b, the flexographic plate 1 is placed in equipment for laser-engraving the black layer 1c. Each 1-bit pixel 3b of the rasterized file 3 is reproduced at the surface of the plate by pulverizing an area, corresponding to a pixel, of the black layer using the laser. The polymer photosensitive layer 1b is thus revealed at this pixel.

Before or after this step, it is possible to have provided a UV rear-face exposure of the plate 1, in order to create or reinforce the medium 1a and form a block base, by cross-linking the rear-face part of the polymer photosensitive layer 1b.

After the engraving step 4b, and during an exposure step 4c, the plate 1 is placed on an exposure frame such as to subject the revealed areas of the photosensitive polymer layer 1b to UV light. Thus, formed on the plate 1 is a latent image of the content 2 by UV exposure of the polymer layer 1b in the revealed areas.

In a following step 4d, the polymer plate is placed on etching equipment. For example, this can be thermal, solvent or water etching, etc. Thus, the part of the polymer layer 1b not revealed to UV is removed, and relief patterns are uncovered, which can be halftone dots or full tones, the upper surfaces of which are designed to receive the printing ink.

Additional steps can be provided, such as, for example, the drying of the developed plate, the exposure of the plate 1 to complete the cross-linking of the relief patterns, a finishing treatment to eliminate the tack of the surface of the plate and prepare the upper surfaces of the relief patterns such that the relief patterns promote the retention of the printing ink, and cutting the plate to individualize blocks thereof.

Regardless of the precise step sequence which is used to form a block, there is, at the end of the manufacturing sequence, at least one block 5 which can be utilized to reproduce, on a printing medium, the textual or graphical content of the original file 2.

This block 5 generally has a rectangular format, the dimensions of which are adjusted to the dimensions of the printing device in which it will be integrated. It is made up of a base 5a which can comprise the transparent medium 1 of the flexographic plate and possibly a part of the cross-linked photosensitive layer 1b, when a UV rear-face exposure of the plate 1 has been carried out.

On the base 5a, a series of relief patterns 5b are placed on a so-called "image" area. These patterns, for example half-tone dots, are in relief, i.e. they have an upper surface 5c that is elevated with respect to the plane defined by the base 5a. These patterns are arranged at the surface of the base 5a such as to represent the content 2. As has already been stated, the upper surface 5c of each pattern can receive printing ink such as to reproduce the content 2 on the printing medium.

The method for manufacturing such a block 5 from a flexographic plate 1 is a method which must be perfectly controlled.

Depending on the nature of the polymer material 1b, the relative hardness of which can be chosen depending on the nature of the medium on which it is envisaged that the content will be printed, depending on the thickness of this layer, the nature and the concentration of the fluids used during the etching step, the durations for exposure and etching must be chosen perfectly such as to perfectly develop the relief patterns 5b. Incorrect control of one of these parameters can result in an insufficient relief or over-etching of the patterns 5b resulting, in any case, in forming a block which cannot be used to achieve a faithful reproduction of the content 2.

The final quality of the block 5 is also dependent upon the very shape of the content 2 or upon the parameters of the prepress operations. Certain parameters of this content (such as the font, the font size, the screen ruling, the screen angle, the shape of the dots), if they are chosen outside a predefined range, can result in forming imperfect relief patterns, or even the absence of such patterns.

The preparation of the rasterized file therefore comprises control and/or adjustment steps ensuring that the 1-bit image will indeed be reproduced as relief "regular" patterns, i.e. having an elevation expected with the preestablished utilization formulas of the manufacturing equipment.

Therefore, every effort is made during these steps such that the relief patterns 5b of the block 5 make it possible to accurately reproduce the content on the printing medium. It is particularly important for the respective elevations of the relief patterns 5b to be identical or very similar to one another, and for all of these patterns or a large majority thereof to indeed be present and to have not been altered during the manufacture of the block 5.

When it is observed that this is not the case, it is necessary to prepare the rasterized file once again, or even the content to be reproduced, in order to remove the part of the file or of the content which cannot be accurately transformed into faithful relief patterns 5b.

It is during these perfecting steps that the inventors of the present application became aware that, in certain cases, a rasterized file representing content 2 could result in forming relief patterns, the elevation of which, not faithful to the expectations, was lower than the expected elevation. These relief patterns, which are excessively etched and/or developed, cannot therefore be inked and contribute to the reproduction of the content on the printing medium.

These observations of unfaithfulness have, of course, resulted in tightening the prepress control rules such as to avoid forming rasterization files having these features, resulting in unusable blocks.

The inventors of the present application have, however, also realized that these observations could be put to good use in order to place information in a block, which information is additional to the content 2 that is intended to be reproduced, and without risking this additional information modifying the graphical and/or textual content reproduced on the printing medium.

This information, which can be integrated upstream of the design and printing process into the rasterized file 3, can for example form identification for the block, a logo, or information that can be used during a method for manufacturing the block, such as cutting squares that make it possible to visually locate the size of the block on the flexographic plate 1 in order to allow the cutting thereof.

Regardless of the nature of this information, it can be represented by relief patterns which are visible to the naked eye.

Of course, in order to not interfere with the content to be reproduced, this information is placed at the surface of the block 5, outside the image area which is made up of relief patterns 5b, the elevation of which is faithful.

Figure 3:
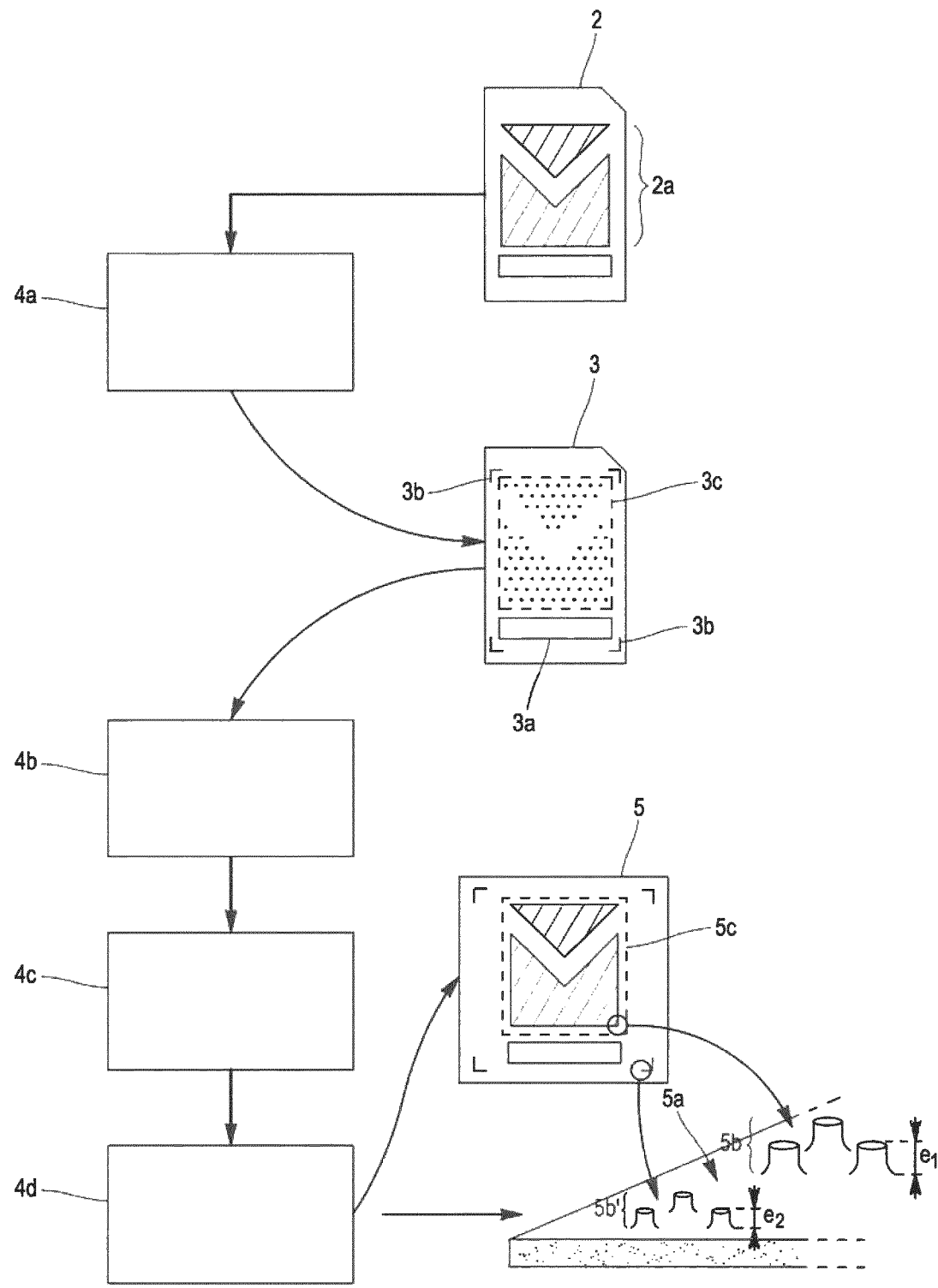
FIG. 3 represents a method of manufacturing a flexographic block in accordance with the invention.

The inventors of the present application have cleverly exploited observations showing a non-sought result, in order to propose a method of manufacturing a flexographic block 5, comprising non-printable visual information. This method is illustrated in FIG. 3.

This method comprises a preparing step 4a for preparing a rasterized file 3 from a content file 2. This file 2 comprises content to be reproduced 2a intended to be placed in an image area of the block, for example centered on the block. The part 3c of the rasterized file 3 corresponding to the image area of the block is made up of 1-bit regular pixels, i.e. the placement and the overall features of which are such that, after the steps of laser engraving 4b, of exposure. 4c and of development 4d of a flexographic plate, the result is a series of relief patterns 5b having a first regular elevation e1, that can reproduce the content 2 on a printing medium.

This step of preparing the file is completed, according to the invention, by additional processing to include in at least one other part 3a, 3b of the rasterized file 3, outside the image area 3c, at least one piece of visible information, which cannot be printed, for example a piece of information for identifying the block 3a or a cutting reference point 3b.

This other part of the file 3a, 3b is made up of 1-bit pixels, the placement and the overall features of which being such that, after the steps of laser engraving 4b, of exposure 4c and of development 4d, the result is a second series of relief patterns 5b' having a second elevation e2 with respect to the base of the plate 5a, that is lower than the first elevation e1 of the relief patterns 5b with a regular elevation forming the first image. It is not necessary for all the relief patterns of the second series of patterns 5b' to have a second identical elevation. These patterns can therefore have different elevations, insofar as these different elevations are lower, for the vast majority thereof, than the first elevation of the "regular" patterns.

Since this second elevation e2, which is lower than the first, is not sufficient for the exposed surface of these patterns to receive ink during printing on the final medium, the patterns 5b' of the second series of relief patterns are therefore not able to be printed on this medium. Nevertheless, they remain clearly visible at the surface of the block or of the flexographic plate used to produce the block 5, which therefore makes it possible to position thereat identification and/or cutting 5b marks.

The overall features of the pixels 5b' of the second series and the placement of these pixels 5b' which result in forming relief patterns with a smaller elevation e2, can be dependent on the nature of the flexographic plate 1, and of the formulas utilized by the equipment for manufacturing the block 5.

These overall features and this placement can, however, be very easily determined using an extremely simple experimental sequence. During this sequence, a calibration rasterized file having a wide variety of overall features and of placement of the pixels is formed. A flexographic plate is processed in order to reproduce, on the plate, the calibration 1-bit rasterized image as defined by the calibration file. Then, the relief patterns which have been formed are observed, for example using a simple microscope, on the developed flexographic plate. It is therefore possible to identify those having an elevation, with respect to the base of the plate, lower than a regular elevation of a relief pattern, but nevertheless sufficient to be visible to the naked eye. Also, the overall features of the 1-bit pixels and the placement thereof having resulted in the formation of these particular relief patterns 5b' are identified.

The inventors of the present application have therefore identified that, on the production equipment thereof, content without compensation or adjustment, formed from a text of "Helvetica Bold" type, a type size between 18 and 24, a percentage less than 0.9%, a screen ruling greater than 170 lpi made it possible to form visible relief patterns, which are not however printable.

This is also the case for the cutting angles, without compensation adjustment, with a dimension less than 0.3 mm in thickness, having a dimension of a few millimeters per side, with a percentage less than 0.9%, and a screen ruling greater than 170 lpi.

Figure 4:
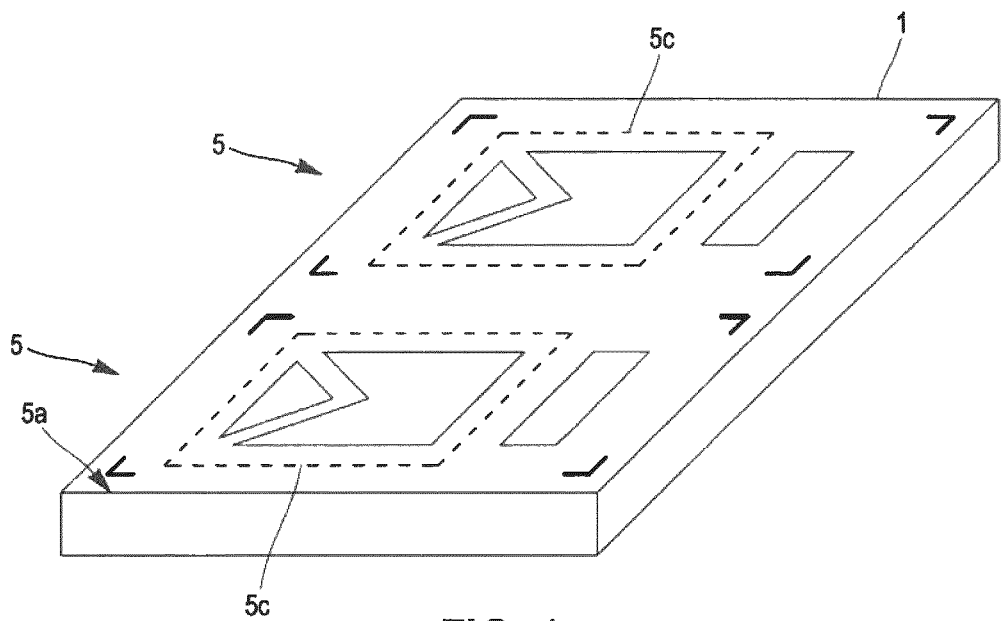
FIG. 4 represents a flexographic plate comprising a plurality of blocks in accordance with the invention.

When a method in accordance with the invention is implemented, it makes it possible to obtain a flexographic plate 1, like that shown in FIGS. 3 and 4, which can be used to produce a flexographic block 5 comprising a base 5a, a first series of relief patterns 5b placed on an image area 5c of the base 5a, the patterns 5b of the first series having a first elevation e1 with respect to the base 5a, and a second series of relief patterns 5b', placed outside the image area 5c, the patterns 5b' of the second series of patterns having a second elevation e2 with respect to the base, the second elevation e2 being lower than the first elevation e1.

As has been seen, these relief patterns 5b' with a lower elevation can be arranged on the base to form the identification information for the block or reference points making it possible to locate the size and the positioning of the block 5 on the flexographic plate 1 and allowing the cutting thereof.

This provides a method making it possible to integrate, upstream of the design and printing process, information that can be directly integrated into a flexographic block, without affecting the graphical and/or textual content to be reproduced.

Of course, the invention is not limited to the mode of implementation described and alternative embodiments can be included without departing from the scope of the invention, which scope is defined by the claims.

Therefore, although the embodiment described relates to the production of a flexographic block, the invention is in no way limited to the production of such a block and is very generally used for the production of any photosensitive printing form for a flexographic printing method. For example, this can be a flexographic sleeve, and in this case the flexographic plate takes the form of a cylinder.

In addition to the steps of rasterization 4a, laser engraving 4b, exposure 4c and development 4d, the method can comprise other steps, such as, for example, cutting, cleaning and/or preparation of surfaces.

The step of preparing the rasterized file 3 is designed to be implemented by a computer, by means of a computer program made up of suitable instructions to implement at least each of the steps of this method.

The invention claimed is:

1. A process for manufacturing a photosensitive flexographic printing form, the process comprising the following steps:
   a) preparing a rasterized 1-bit image file from at least one file of graphical and/or textual content to be printed, the rasterized 1-bit image file defining a first series of relief patterns and a second series of relief patterns;
   b) processing, using the rasterized 1-bit image file, the flexographic printing form to create:
      the first series of relief patterns borne by a base in an image area of the flexographic printing form, the first series of relief patterns representing the graphical and/or textual content to be printed and having a first elevation with respect to the base; and
      the second series of relief patterns borne by the base outside of the image area and having one or more elevations lower than the first elevation with respect to the base.

2. The process of claim 1, wherein the second series of relief patterns defines identification information relating to the photosensitive flexographic printing form.

3. The process of claim 2, wherein the information is in the form of text.

4. The process of claim 1, wherein the second series of relief patterns defines cutting reference points.

5. The process of claim 1, wherein the one or more elevations of the second series of relief patterns are below a level configured to transfer ink to a printed medium.

6. The process of claim 5, wherein the step of processing the flexographic printing form includes laser engraving, exposing, and developing the flexographic printing form.

7. The process of claim 6, wherein the flexographic printing form comprises a photosensitive polymer layer and a layer covering the photosensitive layer, and the laser engraving step comprises using a laser to remove a plurality of areas from the covering layer to reveal the underlying photosensitive polymer layer according to the rasterized 1-bit image file.

8. The process of claim 7, wherein each of the plurality of areas removed from the covering layer corresponds to a 1-bit pixel of the rasterized 1-bit image file.

9. The process of claim 8, wherein the exposing step comprises exposing the photosensitive polymer to UV light through the plurality of areas removed from the covering layer.

10. The process of claim 9, wherein the developing step comprises removing areas of the photosensitive polymer not exposed to the UV light using a thermal, solvent, or water processing step.

11. The process of claim 10, further comprising after the developing step performing one or more steps of:
    a drying step;
    an additional exposure step for completing cross-linking of the polymer in areas corresponding to the first and second series of relief patterns;
    a finishing treatment to detack a surface of the plate; and
    a cutting step.

12. The process of claim 1, wherein the one or more elevations of the second series of relief patterns are below a level configured to receive ink.

13. The process of claim 1, wherein the second series of relief patterns is visible to a naked eye of a human observer.

\* \* \* \* \*